United States Patent
Davies et al.

(10) Patent No.: US 9,571,069 B2
(45) Date of Patent: *Feb. 14, 2017

(54) IMPLEMENTING CLOCK RECEIVER WITH LOW JITTER AND ENHANCED DUTY CYCLE

(71) Applicant: International Business Machines Corporation, Armonk, NY (US)

(72) Inventors: Andrew D. Davies, Rochester, MN (US); Grant P. Kesselring, Rochester, MN (US); Christopher W. Steffen, Rochester, MN (US); James D. Strom, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/696,414

(22) Filed: Apr. 25, 2015

(65) Prior Publication Data
US 2016/0191024 A1    Jun. 30, 2016

Related U.S. Application Data

(63) Continuation of application No. 14/583,963, filed on Dec. 29, 2014, now Pat. No. 9,438,209.

(51) Int. Cl.
| H03K 3/017 | (2006.01) |
| H03L 7/10 | (2006.01) |
| H03K 3/353 | (2006.01) |
| H03K 5/1252 | (2006.01) |
| H03K 3/356 | (2006.01) |

(52) U.S. Cl.
CPC .............. *H03K 3/017* (2013.01); *H03K 3/353* (2013.01); *H03K 5/1252* (2013.01); *H03L 7/10* (2013.01); *H03K 3/356104* (2013.01)

(58) Field of Classification Search
None
See application file for complete search history.

(56) References Cited

U.S. PATENT DOCUMENTS

| 6,256,234 | B1 | 7/2001 | Keeth et al. |
| 6,294,940 | B1 | 9/2001 | Kiehl |
| 6,614,279 | B2 | 9/2003 | Anders et al. |
| 6,757,327 | B1* | 6/2004 | Fiedler ..................... H03H 7/40 375/232 |
| 6,798,251 | B1 | 9/2004 | Schafferer |
| 7,288,980 | B2 | 10/2007 | Lundberg |
| 7,652,937 | B2 | 1/2010 | Searles et al. |
| 7,737,757 | B2 | 6/2010 | Behrends et al. |
| 7,888,966 | B1 | 2/2011 | Davidson et al. |

(Continued)

*Primary Examiner* — Cassandra Cox
(74) *Attorney, Agent, or Firm* — Joan Pennington

(57) ABSTRACT

A method and a clock receiver circuit for implementing low jitter and enhanced duty cycle, and a design structure on which the subject circuit resides are provided. The clock receiver circuit accepts single-ended complementary metal oxide semiconductor (CMOS) and differential clock signals. The clock receiver circuit includes input circuitry coupled to a differential pair that biasing a reference clock and allows for single-ended or differential clock signals. The differential pair uses multiple current mirrors for switching the polarity of the input signals to achieve enhanced jitter performance, and cross coupled inverters for retaining signal symmetry.

5 Claims, 3 Drawing Sheets

(56) References Cited

U.S. PATENT DOCUMENTS

| | | |
|---|---|---|
| 8,164,372 B2 | 4/2012 | Mitsubori et al. |
| 8,179,165 B2 * | 5/2012 | Le .................... H03K 5/131 327/271 |
| 2006/0170453 A1 * | 8/2006 | Zerbe ............. H04L 25/03057 326/37 |
| 2008/0148088 A1 * | 6/2008 | Baumgartner ...... G06F 13/4204 713/503 |
| 2011/0181340 A1 | 7/2011 | Gazit |

* cited by examiner

US 9,571,069 B2

IMPLEMENTING CLOCK RECEIVER WITH LOW JITTER AND ENHANCED DUTY CYCLE

This application is a continuation application of Ser. No. 14/583,963 filed Dec. 29, 2014.

FIELD OF THE INVENTION

The present invention relates generally to the data processing field, and more particularly, relates to a method and a clock receiver circuit for implementing low jitter and enhanced duty cycle, and a design structure on which the subject circuit resides.

DESCRIPTION OF THE RELATED ART

A need exists for an enhanced clock receiver circuit having low jitter, enhanced duty cycle, and that accepts broad common mode voltage range, providing effective operation in high noise environments.

SUMMARY OF THE INVENTION

Principal aspects of the present invention are to provide a method and a clock receiver circuit for implementing low jitter and enhanced duty cycle, and a design structure on which the subject circuit resides. Other important aspects of the present invention are to provide such method and circuit substantially without negative effects and that overcome some disadvantages of prior art arrangements.

In brief, a method and a clock receiver circuit for implementing low jitter and enhanced duty cycle, and a design structure on which the subject circuit resides are provided. The clock receiver circuit accepts single-ended complementary metal oxide semiconductor (CMOS) and differential clock signals. The clock receiver circuit includes input circuitry coupled to a differential pair that biasing a reference clock and allows for single-ended or differential clock signals. The differential pair uses multiple current mirrors for switching the polarity of the input signals to achieve enhanced jitter performance, and cross coupled inverters for retaining signal symmetry.

In accordance with features of the invention, the input circuitry biasing prior to the differential pair allows for better current steering while accepting a broader common mode voltage range.

In accordance with features of the invention, the jitter is lower than other designs with good duty cycle because the power supply boundary crossing is made differentially rather than single-endedly.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and a clock receiver circuit for implementing low jitter and enhanced duty cycle, and a design structure on which the subject circuit resides are provided. The clock receiver circuit accepts, for example, single-ended complementary metal oxide semiconductor (CMOS) and differential current mode logic (CML), differential emitter coupled logic (ECL), and monolithic emitter coupled logic (MECL) clock signals. The clock receiver circuit includes input circuitry coupled to a differential pair. The input circuitry biases a reference clock and allows for single-ended and differential signals based on the input. The input circuitry biasing prior to the differential pair allows for better current steering while accepting a broader common mode voltage range. The two differential pair uses multiple current mirrors to swap the polarity of the input signals to achieve better jitter performance, and cross coupled inverters enable retaining good symmetry.

Figure 1A:
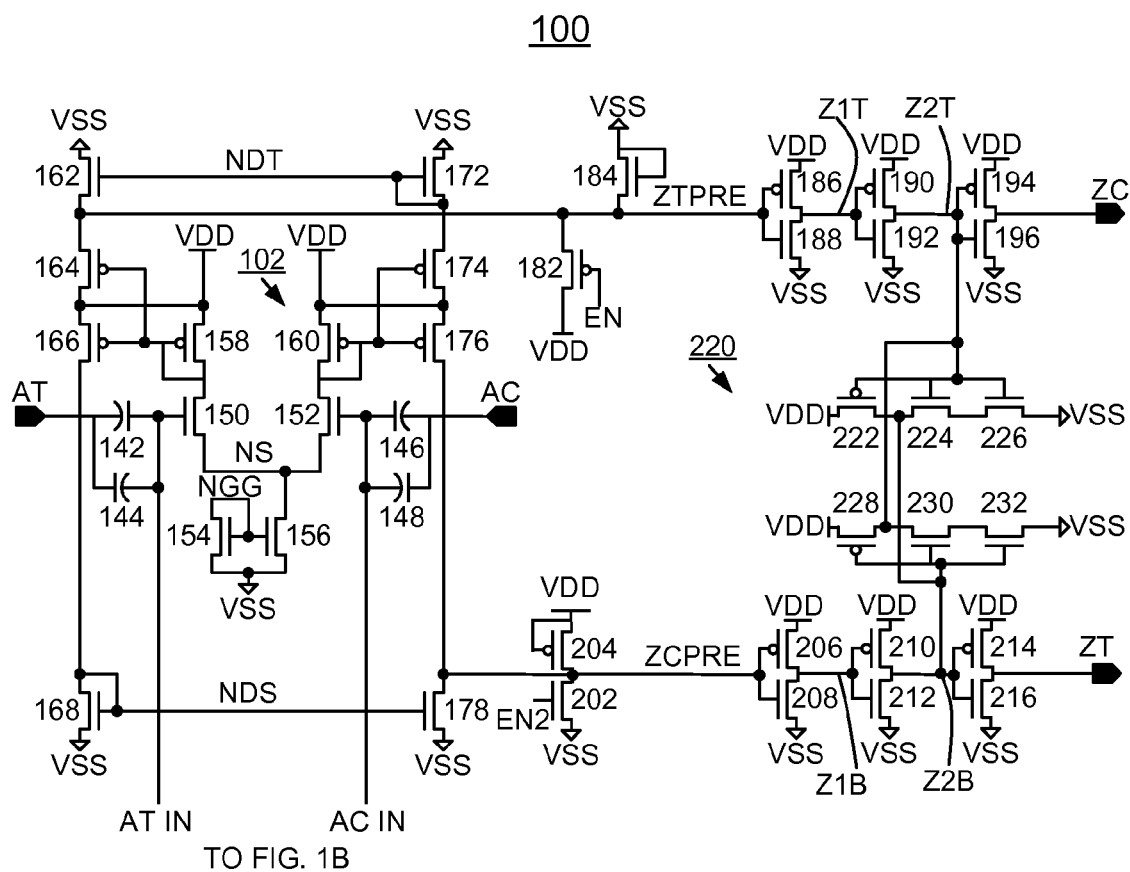
FIGS. 1A and 1B provides a schematic diagram representation of clock receiver circuit for implementing low jitter and enhanced duty cycle, and also serves as a level translator in accordance with the preferred embodiment.
Figure 1B:
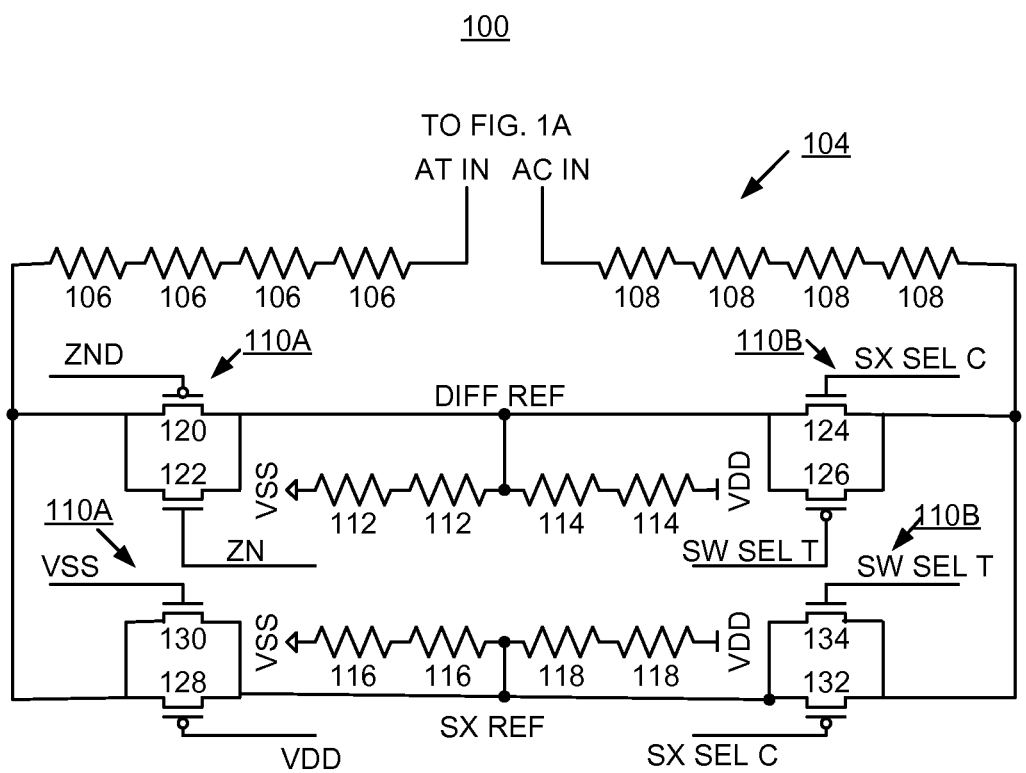

Having reference now to the drawings, in FIGS. 1A and 1B, there is shown an example clock receiver circuit for implementing low jitter and enhanced duty cycle, and also serves as a level translator in accordance with a preferred embodiment generally designated by the reference character 100. The clock receiver circuit 100 enables low jitter and enhanced duty cycle, accepting a broad common mode voltage range, providing effective operation in high noise environments. The clock receiver circuit 100 also serves as a level translator.

In FIGS. 1A and 1B, the clock receiver circuit 100 includes a differential pair generally designated by the reference character 102 with input circuitry generally designated by the reference character 104 illustrated in FIG. 1B. Input circuitry 104 biases the reference clock and allows for single-ended or differential signals based on the input. The biasing prior to the differential pair 102 allows for better current steering while accepting a broader common mode voltage range. The jitter is lower than other known designs with good duty cycle because the power supply boundary crossing is made differentially rather than single-endedly.

Input circuitry 104 includes input connections AT IN, AC IN to FIG. 1A each respectively connected via a plurality of series connected resistors 106, 108 to a respective select N-channel field effect transistor (NFET) and P-channel field effect transistor (PFET) pairs 110A, 110B. Input circuitry 104 includes the respective NFET and PFET pairs 110A, 110B connected between respective input connections AT IN, AC IN and a respective reference level DIFF REF, and SX REF. A resistor voltage divider formed by a plurality of resistors 112, 114 connected between voltage rails VSS, VDD include a common connection to the reference level DIFF REF. A resistor voltage divider formed by a plurality of resistors 116, 118 connected between voltage rails VSS, VDD include a common connection to the reference level SX REF.

The NFET and PFET pair 110A connected between the input connection nodes AT IN and reference level DIFF REF includes a PFET 120 receiving a gate input ZND and an NFET 122 receiving a gate input ZN. The NFET and PFET pair 110B connected between the input connection nodes AC IN and reference level DIFF REF includes an NFET 124 receiving a gate input SX SEL C and a PFET 126 receiving a gate input SW SEL T.

The NFET and PFET pair 110B connected between the input connection nodes AT IN and reference level SX REF includes a PFET 128 receiving a gate input VDD and an NFET 130 receiving a gate input VSS. The NFET and PFET pair 110B connected between the input connection nodes AC IN and reference level SX REF includes a PFET 132 receiving a gate input SX SEL C and an NFET 134 receiving a gate input SW SEL T.

In operation of input circuitry 104, in the differential and single ended mode, the gate input ZND to PFET 120 is low and the gate input ZN to NFET 122 is high, and PFET 120 and NFET 122 are ON. In the differential mode, the gate input SX SEL C to NFET 124 and PFET 132 is high and the gate input SW SEL T to PFET 126 and NFET 134 is low, and NFET 124, and PFET 126 are ON, and NFET 134 and PFET 132 are OFF. In the single ended mode, the gate input SX SEL C to NFET 124 and PFET 132 is low and the gate input SW SEL T to PFET 126 and NFET 134 is high, and NFET 124, and PFET 126 are OFF, and NFET 134 and PFET 132 are ON. In a disable mode PFET 120, NFET 122; NFET 124, PFET 126; PFET 128, NFET 130; and PFET 132, NFET 134 are all OFF. PFET 128 and NFET 130 are always off and are in input circuitry 104 to balance noise and leakage in all modes. The series resistors 106, 108, 112, 114, 116 and 118 can be provided as one resistor. The resistors 106, 108, 112, 114, 116 and 118 are an artifact of a Cadence schmatic tool.

In FIG. 1A, the clock receiver circuit 100 includes inputs AT, AC connected by respective parallel capacitor pairs 142, 144; and 146, 148 to the differential pair 102 at the input connections nodes AT IN, AC IN from FIG. 1B. The NFETs 150, 152 having a gate connection to the input connections nodes AT IN, AC IN, a common connection node NS connected via NFET 154, to voltage rail VSS. A diode connected NFET 156 connected to voltage rail VSS provides a gate input to NFET 154. A current source drives node NGG.

The clock receiver circuit 100 includes an N-channel field effect transistor (NFET) 162 connected to the voltage rail VSS and series connected with a respective first series connected pair of a P-channel field effect transistors (PFETS) 164, 166 and an N-channel field effect transistor (NFET) 168 and a second NFET 172 connected to the voltage rail VSS series connected pair of PFETs 174, 176 and NFET 178. A common gate connection of the NFETs 162, 172 is connected to node NDT. A common gate connection of PFETs 164, 166 is connected to the gate of a PFET 158 and a common gate connection of PFETs 174, 176 is connected to the gate of a PFET 160. The PFETs 158, 160 are connected to voltage rail VDD and series connected to the respective differential pair NFETs 150, 152. The common connection of PFET 158, NFET 150 is connected to the gate of PFET 158, and the common connection of PFET 160, NFET 152 is connected to the gate of PFET 160. A common gate connection of the NFETs 168, 178 is connected to node NDS.

The common connection of NFET 162, and PFET 164 at node ZTPRE is connected to a PFET 182 connected to voltage rail VDD. PFET 182 receives a gate input EN. An NFET 184 is connected between voltage rail VSS and node ZTPRE with the gate shorted to the source so it is always off. A plurality of inverters is formed by respective series connected PFET 186 and NET 188; series connected PFET 190 and NET 192; and series connected PFET 194 and NET 196 connect between the voltage rails VDD and VSS and to respective nodes ZTPRE, Z1T, Z2T, and output ZC. The inverters swap the polarity of the input signals achieving better jitter performance.

The NFET 178 and series connected PFET 176 at node ZCPRE is connected to a common connection of an NFET 202 and a PFET 204 connected to voltage rail VDD. NFET 202 receives a gate input ENB. The gate-source connected PFET 204 is connected between voltage rail VDD and node ZCPRE. A plurality of inverters is formed by respective series connected PFET 206 and NET 208; series connected PFET 210 and NET 212; and series connected PFET 214 and NET 216 connected between the voltage rails VDD and VSS and to respective nodes ZCPRE, Z1B, Z2B, and output ZT. The inverters swap the polarity of the input signals achieving better jitter and duty cycle performance.

The clock receiver circuit 100 includes cross coupled inverters generally designated by the reference character 220 are connected between inverters at nodes Z2T, Z2B helping to retain good duty cycle. The cross coupled inverters include a PFET 222, and series connected NFETs 224, 226 and a PFET 228, and series connected NFETs 230, 232, each connected between the voltage rails VDD and VSS. Inverter node Z2B is connected to a common drain of PFET 222, and series connected NFETs 224, 226 and to the common gate connection of PFET 228 and NFETs 230, 232. Inverter node Z2T is connected to a drain connection of PFET 228, and series connected NFETs 230, 232 and to the common connection of PFET 222 and NFETs 224, 226. The NFETs 224, 226 and NFETs 230, 232 are NMOS FETs and could be one FET each. To get an effectively longer transistor length, the series connected NFETs 224, 226 and series connected NFETs 230, 232 are used because the longer transistor length can not be achieved with one transistor.

Figure 2:
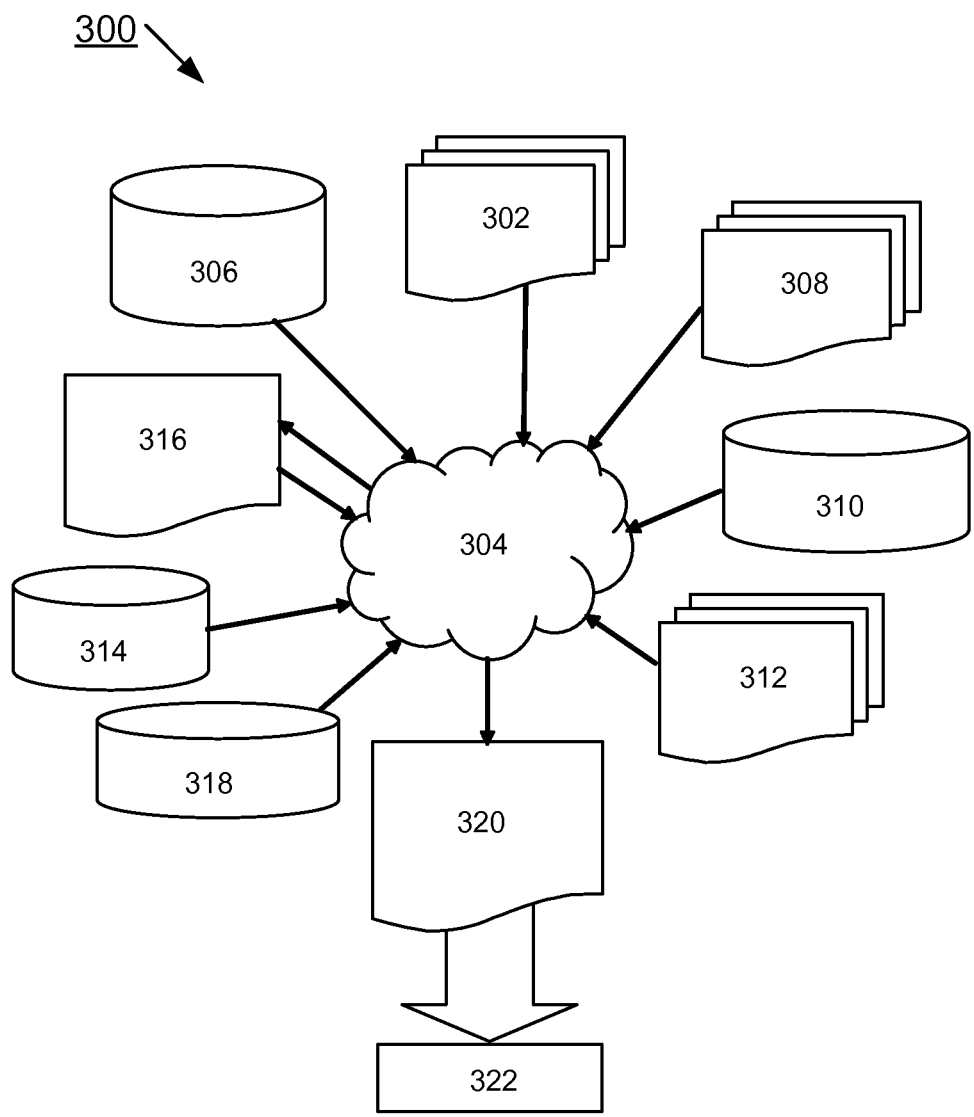
FIG. 2 is a flow diagram of a design process used in semiconductor design, manufacturing, and/or test.

FIG. 2 shows a block diagram of an example design flow 300. Design flow 300 may vary depending on the type of IC being designed. For example, a design flow 300 for building an application specific IC (ASIC) may differ from a design flow 300 for designing a standard component. Design structure 302 is preferably an input to a design process 304 and may come from an IP provider, a core developer, or other design company or may be generated by the operator of the design flow, or from other sources. Design structure 302 comprises circuit 100 in the form of schematics or HDL, a hardware-description language, for example, Verilog, VHDL, C, and the like. Design structure 303 may be contained on one or more machine readable medium. For example, design structure 302 may be a text file or a graphical representation of circuit 100. Design process 304 preferably synthesizes, or translates, circuit 100 into a netlist 306, where netlist 306 is, for example, a list of wires, transistors, logic gates, control circuits, I/O, models, etc. that describes the connections to other elements and circuits in an integrated circuit design and recorded on at least one of machine readable medium. This may be an iterative process in which netlist 306 is resynthesized one or more times depending on design specifications and parameters for the circuits.

Design process 304 may include using a variety of inputs; for example, inputs from library elements 302 which may house a set of commonly used elements, circuits, and devices, including models, layouts, and symbolic representations, for a given manufacturing technology, such as different technology nodes, 14 nm, 22 nm, 32 nm, 45 nm, 90 nm, and the like, design specifications 310, characterization data 312, verification data 314, design rules 316, and test data files 312, which may include test patterns and other testing information. Design process 304 may further include, for example, standard circuit design processes such as timing analysis, verification, design rule checking, place and route operations, and the like. One of ordinary skill in the art of integrated circuit design can appreciate the extent of possible electronic design automation tools and applications used in design process 304 without deviating from the scope and spirit of the invention. The design structure of the invention is not limited to any specific design flow.

Design process 304 preferably translates an embodiment of the invention as shown in FIGS. 1A and 1B along with any additional integrated circuit design or data (if applicable), into a second design structure 320. Design structure 320 resides on a storage medium in a data format used for the exchange of layout data of integrated circuits, for example, information stored in a GDSII (GDS2), GL1, OASIS, or any other suitable format for storing such design structures. Design structure 320 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1A and 1B. Design structure 320 may then proceed to a stage 322 where, for example, design structure 320 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing a clock receiver circuit for implementing low jitter and enhanced duty cycle comprising:
    providing an input circuit biasing a reference clock and allowing for single-ended complementary metal oxide semiconductor (CMOS) or differential clock signals;
    providing the biased single-ended complementary metal oxide semiconductor (CMOS) or differential clock signals coupled to a differential transistor pair;
    providing a biasing capacitor coupled to said differential transistor pair;
    providing multiple current mirrors coupled to said differential transistor pair for switching the polarity of input clock signals for enhanced signal performance, and
    providing cross coupled inverters coupled between said current mirrors for retaining clock signal symmetry.

2. The method as recited in claim 1 wherein said input circuit enables enhanced current steering and an enhanced common mode voltage range.

3. The method as recited in claim 1 wherein said biasing capacitor and said differential transistor pair function as a level translator.

4. A method for implementing a clock receiver circuit for implementing low jitter and enhanced duty cycle comprising:
    providing an input circuit biasing a reference clock and allowing for single-ended complementary metal oxide semiconductor (CMOS) or differential clock signals;
    providing the biased single-ended complementary metal oxide semiconductor (CMOS) or differential clock signals coupled to a differential transistor pair;
    providing multiple current mirrors coupled to said differential transistor pairs includes implementing each said current mirror with a series P-channel field effect transistor (PFET) and an N-channel field effect transistor (NFET) connected between voltage rails (VDD, VSS), and
    providing cross coupled inverters coupled between said current mirrors for retaining clock signal symmetry.

5. A method for implementing a clock receiver circuit for implementing low jitter and enhanced duty cycle comprising:
    providing an input circuit biasing a reference clock and allowing for single-ended complementary metal oxide semiconductor (CMOS) or differential clock signals;
    providing the biased single-ended complementary metal oxide semiconductor (CMOS) or differential clock signals coupled to a differential transistor pair;
    providing a biasing capacitor coupled to said differential transistor pair; said biasing capacitor and said differential transistor pair function as a level translator;
    providing multiple current mirrors coupled to said differential transistor pair for switching the polarity of input clock signals for enhanced signal performance, and
    providing cross coupled inverters coupled between said current mirrors for retaining clock signal symmetry-includes implementing each said inverter with a series connected P-channel field effect transistor (PFET) and a pair of N-channel field effect transistors (NFETs) connected between the voltage rails (VDD, VSS).

* * * * *